March 7, 1967 YASUHARU KUBOTA ETAL 3,308,403

OSCILLATOR CIRCUIT

Filed April 3, 1964

Inventors
Yasuharu Kubota
Tsuneo Utsunomiya by Hill, Sherman, Meroni, Gross & Simpson Attys.

United States Patent Office 3,308,403
Patented Mar. 7, 1967

3,308,403
OSCILLATOR CIRCUIT
Yasuharu Kubota, Ichikawa-shi, and Tsuneo Utsunomiya, Tokyo, Japan, assignors to Sony Corporation, Shinagawa-ku, Tokyo, Japan, a corporation of Japan
Filed Apr. 3, 1964, Ser. No. 357,165
Claims priority, application Japan, Apr. 26, 1963, 38/21,842
12 Claims. (Cl. 334—65)

This invention relates to an oscillator circuit, and more particularly to a local oscillator circuit to be used in a tuner of television receivers.

As is well-known, television signals in the VHF range are transmitted over a first group of relatively lower frequency channels (i.e. channel Nos. 2–6) and over a second group of channels occupying a substantially higher band of frequencies (i.e. channel Nos. 7–13).

The television receiver is provided with a tuner device by means of which a desired TV channel is selected. In this case, a fine-tuning device comprising a variable inductor or a variable capacitor of small value is generally added to the aforementioned tuner.

However, the variation of oscillating frequency in response to a given variation of capacitance or inductance of the fine-tuning device differs substantially as between the low-band VHF and high-band VHF channels referred to above. This will hereinbelow be explained concretely. That is, as a fine-tuning capacitor is varied from a minimum to a maximum value a certain variation in oscillating frequency will be obtained. In channel No. 3 of the United States standard TV system (frequency band 60–66 megacycles), a frequency variation of about ±1 mc./s. can be obtained. On the other hand, in channel No. 12 (frequency band 204–210 mc./s.) a frequency variation of as much as about ±3 mc./s. is caused.

As is apparent from the foregoing, the amount $\Delta f$ of frequency variation of the tuner in the high-band VHF channels is substantially larger than that in the low-band VHF channels, and the frequency variations do not ever become uniform throughout all channels. This makes the fine-tuning operation extremely difficult.

One object of the present invention is to provide a novel oscillator circuit for television receivers which overcomes the foregoing difficulty.

Another object of the present invention is to provide an improved oscillator circuit which comprises a fine-tuning device.

A further object of the present invention is to provide an oscillator circuit in which a constant frequency variation may always be obtained for a given variation of the fine tuning device independently of the channel which has been selected.

Other objects, features and advantages of the present invention will become apparent from the following description taken in conjunction with the accompanying drawings, in which.

Figure 1:
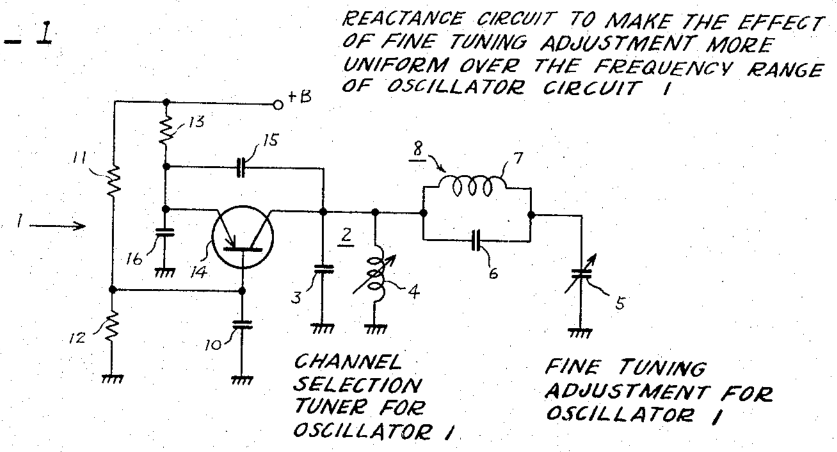
FIGURE 1 is a circuit diagram illustrating an example of the oscillator circuit of the present invention.

Referring now to the drawing, 1 is an oscillator circuit including a transistor 14, which functions as a local oscillator of, for example, a television receiver. 2 is a resonance circuit composed of a capacitor 3 and a variable inductor 4. To this resonance circuit 2, there is connected in parallel thereto, for instance a variable capacitor 5 for frequency fine-tuning. In place of the variable capacitor 5 a variable inductance may be used. As is usual, for example the inductance 4 of the resonance circuit 2 is adjusted in accordance with channel selection to be received.

In the present invention, a parallel resonance circuit 8 consisting of a capacitor 6 and an inductance 7 is inserted between the resonance circuit 2 and a fine-tuning device to be connected thereto, as illustrated in FIGURE 1. Then, the resonance frequency $f_0$ of the parallel resonance circuit is made to coincide with a predetermined frequency in a space band or gap in the frequency spectrum between a high frequency zone and a low frequency zone.

Figure 2A:
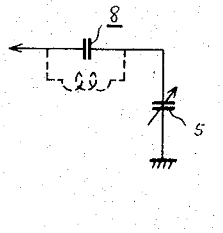
FIGURES 2A and 2B are equivalent circuit diagrams each illustrating one part of the circuit shown in FIGURE 1.
Figure 3:
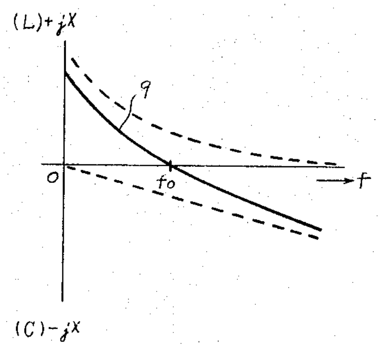
FIGURE 3 is a graph for explaining the circuit of the present invention.
Figure 2B:
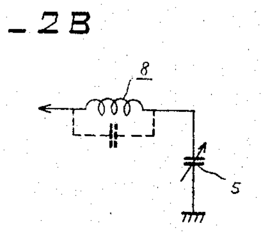

With such circuit arrangement, in the high frequency zone the inductance 7 is negligible as shown in FIGURE 2A and the parallel resonance circuit 8 will be substantially capacitive in equivalent. In the low frequency zone the capacitor 6 is substantially negligible and the circuit will be inductive in equivalent. That is, this resonance circuit 8 becomes capacitive ($-jX$) in the high frequency zone and inductive ($+jX$) in the low frequency zone as illustrated by the admittance curve 9 in FIGURE 3. Accordingly, it is considered that the capacity due to the parallel resonance circuit 8 and that of the capacitor 5 of the fine-tuning circuit are inserted in series in the high frequency zone, and consequently frequency variations due to the capacity variation of the capacitor 5 become small. On the contrary, since the parallel resonance circuit 8 presents essentially an inductive reactance in the low frequency zone, the circuit is regarded as shown in FIGURE 2B. Consequently, frequency variation due to the capacity variation of the capacitor becomes large in the low frequency zone.

The circuit 8 may be termed a frequency responsive reactance circuit which presents a different reactance characteristic over the first or lower range of oscillation frequencies to which the local oscillator circuit is tuned in receiving transmitted signals in the relatively lower frequency zone as compared to its reactance characteristic over the second or higher range of oscillation frequencies to which the local oscillator circuit is tuned in receiving transmitted signal frequencies in the relatively higher frequency zone. Such different reactance characteristics are examplified by the inductive reactance portion and the capacitive reactance portion of the curve 9 in FIGURE 3.

An example of the present invention will hereinbelow be explained.

The space band or gap between the low-band VHF zone and the high-band VHF zone in United States standard TV system corresponds to 88 mc./s. to 174 mc./s. In the following example, it was selected that $f_0=150$ mc./s.

| | |
|---|---|
| Capacitors: | |
| **3** | 10 micromicrofarads. |
| **5** | Max. 4 micromicrofarads. |
| **6** | 30 micromicrofarads. |
| **10** | 0.005 microfarads. |
| **15** | 3 micromicrofarads. |
| **16** | 5 micromicrofarads. |
| Inductors: | |
| **4** | Inductors to be selected according to desired channel. |
| **7** | 0.037 microhenries. |
| Resistors: | |
| **11** | 2.2 kilohms. |
| **12** | 10 kilohms. |
| **13** | 1.0 kilohms. |
| Voltage: | |
| +B | 12 volts D.C. |
| Transistor: | |
| **14** | 2SA161. |

The values of the capacitor 6 and the inductor 7 respectively include stray capacitance and inductance. According to this invention, frequency variation could be made ±2 mc./s. or less in channel No. 13 (frequency band 210–216 mc./s.).

In accordance with the present invention, the capacity variation of the entire circuit due to the capacity variation of the capacitor 5 in the high frequency zone may be made smaller than that in low frequency zone so that by using a circuit such as described above substantially uniform frequency fine tuning can be effected throughout the VHF range. Therefore, there are great advantages particularly when the present invention is applied to a frequency fine tuning device of an oscillator circuit in a television receiver in which the high and low frequency zones are considerably laid apart.

It will be apparent that many modifications and variations may be effected without departing from the scope of the novel concepts of the present invention.

What is claimed is:

1. An oscillator circuit comprising a variable tuning element, a fine-tuning device, a parallel resonance circuit, and means for shunting said variable tuning element with said fine-tuning device and said parallel resonance circuit, the frequency variation produced by a given adjustment of said fine-tuning device being substantially constant independent of the oscillating frequency of said circuit.

2. An oscillator circuit comprising a variable tuning element to be selected in accordance with the frequency of a transmitted signal to be received, a fine-tuning device coupled to said variable tuning element, and a parallel resonance circuit connected to said fine-tuning device, said parallel resonance circuit being capacitive in a high frequency zone of signals to be received and inductive in a low frequency zone, and the resonance frequency of said parallel resonance circuit corresponding to a space band between said high and low frequency zones.

3. A tuning system comprising an oscillator circuit having a variable tuner operable to selectively adjust the oscillation frequency of the oscillator circuit over a first range of relatively lower oscillation frequencies and over a second range of relatively higher oscillation frequencies, a fine-tuning device coupled to said variable tuner and adjustable to provide a relatively fine adjustment of oscillation frequency of said oscillator circuit, and a frequency responsive reactance circuit connected in circuit with said fine-tuning device and presenting a different reactance characteristic over said first range of oscillation frequency of said oscillator circuit as compared to its reactance characteristic over said second range of oscillation frequencies, the combined effect of the fine tuning device and the frequency responsive reactance circuit on the oscillation frequency of the oscillator circuit for a given adjustment of the fine tuning device being substantially more uniform over said first and second ranges of oscillation frequencies than would be the case without said frequency responsive reactance circuit.

4. The tuning system of claim 3 with the fine tuning device comprising a variable capacitor and the frequency responsive reactance circuit providing a capacitive reactance in series with the variable capacitor in said second range of oscillation frequency.

5. The tuning system of claim 3 with said frequency responsive reactance circuit presenting a capacitive reactance over one of said first and second ranges of oscillation frequency and presenting an inductive reactance over the other of said ranges of oscillation frequency.

6. The tuning system of claim 5 with the fine tuning device comprising a variable capacitor and the frequency responsive reactance circuit comprising a parallel resonance circuit, the parallel resonance circuit and the variable capacitor being connected in a series circuit which series circuit is connected in shunt with said variable tuner.

7. The tuning system of claim 5 with the first and second ranges of oscillation frequency corresponding to reception of respective transmitted signal frequencies in a relatively lower and in a relatively higher frequency zone which zones are separated by a space band of substantial extent, and the frequency responsive reactance circuit comprising a resonance circuit tuned to an oscillation frequency corresponding to a signal frequency in said space band so that said resonance circuit presents a capacitive reactance over one of said first and second ranges of oscillation frequency and presents an inductive reactance over the other of said ranges of oscillation frequency.

8. The tuning system of claim 7 with the relatively lower frequency zone comprising frequencies up to about 88 megacycles per second and the relatively high frequency zone comprising frequencies above about 174 megacycles per second, the adjustment of the fine tuning device which produces a frequency variation in oscillation frequency of from minus 1 megacycle per second to plus 1 megacycle per second when the variable tuner is adjusted to receive a frequency band of 60 to 66 megacycles per second producing a frequency variation of not more than about from minus 2 megacycles per second to plus 2 megacycles per second when the variable tuner is adjusted to receive a frequency band of 210 to 216 megacycles per second.

9. An oscillator capable of being tuned over each of two spaced bands of frequencies, the oscillator comprising a main tuning circuit having a variable tuning element capable of tuning the main tuning circuit at least approximately to a chosen frequency, a fine-tuning device, a parallel resonant coupling circuit, resonant at a frequency in the space between the two bands of frequencies, and means for coupling the fine-tuning device and the parallel resonant coupling circuit to the variable tuning element of the main tuning circuit, the circuit parameters being such that the effective frequency range of the fine-tuning device is substantially independent of the frequnecy to which the oscillator is tuned where the oscillator is tuned within said bands of frequencies.

10. An oscillator as claimed in claim 9 wherein the impedance of the parallel resonant circuit is capacitive in the higher of the two bands of frequencies and is inductive in the lower of the two bands.

11. A television receiver having a local oscillator for tuning the receiver to each frequency channel of two spaced groups of channels, the oscillator comprising a main tuning circuit having a variable tuning element capable of tuning the main tuning circuit at least approximately to respective frequencies in spaced frequency ranges corresponding to carrier frequencies of respective channels of said two spaced groups of channels, a fine-tuning device, a parallel resonant coupling circuit resonant at a frequency between said spaced frequency ranges, and means for coupling the fine-tuning device and the parallel resonant coupling circuit to the variable tuning element of the main tuning circuit, the circuit parameters being such that the effective frequency range of the fine-tuning device is substantially independent of the frequency to which the oscillator is tuned.

12. The receiver of claim 11 wherein one of said two spaced groups of channels has an upper frequency of about 88 megacycles per second and the other of said two spaced groups of channels has a lower frequency of about 174 megacycles per second.

References Cited by the Examiner

UNITED STATES PATENTS

| | | | |
|---|---|---|---|
| 2,154,692 | 4/1939 | Mountjoy | 325—376 |
| 2,281,661 | 5/1942 | Barton | 325—383 |
| 2,798,954 | 5/1957 | Gossard | 334—51 |

ELI LIEBERMAN, *Primary Examiner.*

R. F. HUNT, Jr., *Assistant Examiner*